US012757709B2

(12) United States Patent
Lanzillo et al.

(10) Patent No.: US 12,757,709 B2
(45) Date of Patent: Oct. 6, 2026

(54) LINE EXTENSION FOR SKIP-LEVEL VIA LANDING

(71) Applicant: International Business Machines Corporation, Armonk, NY (US)

(72) Inventors: Nicholas Anthony Lanzillo, Wynantskill, NY (US); Lawrence A. Clevenger, Saratoga Springs, NY (US); Brent A. Anderson, Jericho, VT (US); Ruilong Xie, Niskayuna, NY (US); Reinaldo Vega, Mahopac, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 519 days.

(21) Appl. No.: 17/943,799

(22) Filed: Sep. 13, 2022

(65) Prior Publication Data

US 2024/0088018 A1 Mar. 14, 2024

(51) Int. Cl.
*H10W 20/42* (2026.01)
*H10W 20/43* (2026.01)

(52) U.S. Cl.
CPC .......... *H10W 20/42* (2026.01); *H10W 20/43* (2026.01)

(58) Field of Classification Search
CPC .............. H01L 23/5226; H01L 23/528; H01L 23/5283; H01L 23/481; H01L 23/532; H01L 23/53204; H10W 20/42; H10W 20/43; H10W 20/421
See application file for complete search history.

(56) References Cited

U.S. PATENT DOCUMENTS

| | | | | |
|---|---|---|---|---|
| 9,805,972 | B1 * | 10/2017 | Zhang | H01L 21/288 |
| 10,109,526 | B1 | 10/2018 | Zhang et al. | |
| 10,157,833 | B1 | 12/2018 | Zhang et al. | |
| 10,978,388 | B2 | 4/2021 | Amanapu et al. | |
| 11,315,827 | B2 | 4/2022 | Huang et al. | |
| 2016/0086885 | A1 | 3/2016 | Inagaki et al. | |
| 2021/0082747 | A1 | 3/2021 | Mignot et al. | |
| 2021/0280456 | A1 * | 9/2021 | Huang | H01L 21/76897 |

* cited by examiner

*Primary Examiner* — Calvin Y Choi

(74) *Attorney, Agent, or Firm* — Scully, Scott, Murphy & Presser, P.C.; Kimberly Zillig

(57) ABSTRACT

A skip-level via structure is provided that electrically connects a third level of interconnect wiring to a first level of interconnect wiring or a fourth level of interconnect wiring to a first level of interconnect wiring. In the first instance, the skip-level via structure enables connection even when the first level of interconnect wiring and the third level of interconnect wiring do not line up. In the second instance, the skip-level via structure enables a low resistance connection of the fourth level of interconnect wiring to the first level of interconnect wiring due to increased contact area.

16 Claims, 1 Drawing Sheet

LINE EXTENSION FOR SKIP-LEVEL VIA LANDING

BACKGROUND

The present application relates to semiconductor technology, and more particularly to a semiconductor structure including a skip-level via structure that electrically connects spaced apart interconnect wiring levels, e.g., the first interconnect wiring level and the third interconnect wiring level.

In semiconductor technology, a skip-level via (or oftentimes referred to as a "super-Via") can be formed through many dielectric material layers, bypassing one or more wiring structures within the dielectric material layers, to connect with a lower wiring structure. This provides improved resistance characteristics, minimizes capacitance for a lower wiring structure, e.g., at M0 layer, as well as provides area efficiencies in the chip manufacturing process.

SUMMARY

A skip-level via structure is provided that electrically connects a third level of interconnect wiring to a first level of interconnect wiring or a fourth level of interconnect wiring to a first level of interconnect wiring. In the first instance, the skip-level via structure enables connection even when the first level of interconnect wiring and the third level of interconnect wiring do not line up. In the second instance, the skip-level via structure enables a low resistance connection of the fourth level of interconnect wiring to the first level of interconnect wiring due to increased contact area.

In one aspect of the present application, a semiconductor structure including a skip-level via structure is provided. In one embodiment, the semiconductor structure includes a first interconnect wiring level including a plurality of first wiring structures, a second interconnect wiring level including a plurality of second wiring structures, and a third interconnect wiring level including a plurality of third wiring structures, wherein the second interconnect wiring level is between the first interconnect wiring level and the third interconnect wiring level, and the plurality of first wiring structures and the plurality of third wiring structures are oriented in a same lateral direction and wherein the plurality of first wiring structures and the plurality of third wiring structures are laterally offset from each other. The structure further includes a skip-level via structure electrically connecting the first interconnect wiring level and the third interconnect wiring level.

In another embodiment, the semiconductor structure includes a first interconnect wiring level including a plurality of first wiring structures, a second interconnect wiring level including a plurality of second wiring structures, a third interconnect wiring level including a plurality of third wiring structures, and a fourth interconnect wiring level including a plurality of fourth wiring structures, wherein the third interconnect wiring level is located between the second interconnect wiring level and the fourth interconnect wiring level, and wherein the plurality of first wiring structures and the plurality of fourth wiring structures run perpendicular to each other. The structure further includes a skip-level via structure electrically connecting the first interconnect wiring level and the fourth interconnect wiring level.

DETAILED DESCRIPTION

Figure 1:
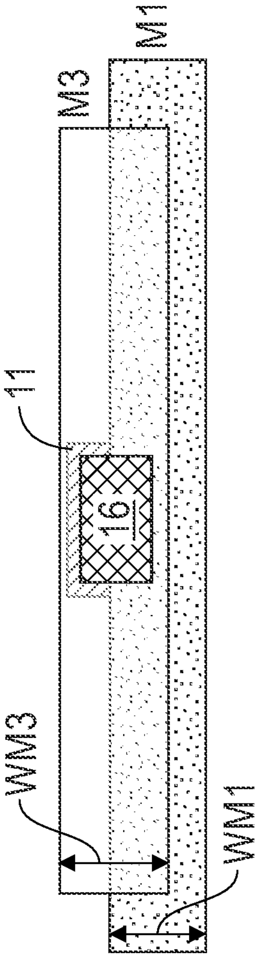
FIG. 1 is a top down view illustrating an exemplary semiconductor structure in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides semiconductor structures (i.e., interconnect structures which define a back-end-of-the-line (BEOL) level) including a plurality of interconnect wiring levels in which a skip-level via structure is used to electrically connect spaced apart interconnect wiring levels, e.g., a first interconnect wiring level and a third interconnect wiring level or a first interconnect wiring level and a fourth interconnect wiring level. To improve the resistance of the skip-level via structure, an extension region is provided to one of the wiring structures present in the lowest interconnect wiring level that the skip-level via structure connects to. Although not shown, the semiconductor structures of the present application are formed above a front-end-of-the-line (FEOL) level that includes a plurality of semiconductor devices, such as, for example, transistors, capacitors, and/or diodes formed on, or within, a semiconductor substrate. A middle-of-the-line (MOL) level can be positioned between the FEOL level and the semiconductor structures of the present application. The MOL level includes various contact structures such as, for example, source/drain contact structures and/or gate contact structures, which provide electrically connection of the devices in the FEOL level to the wiring structures provided in the BEOL level.

Figure 2:
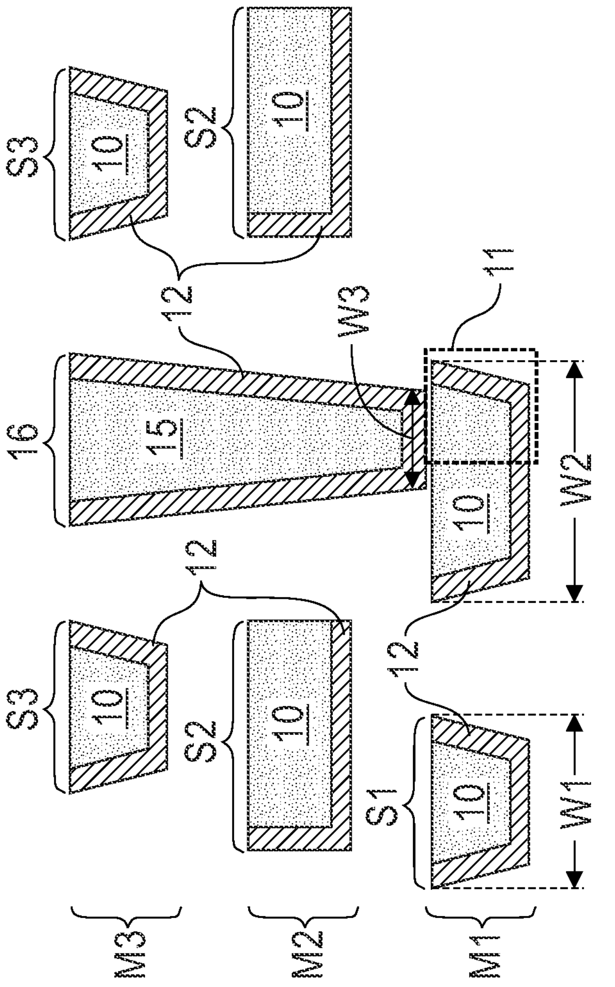
FIG. 2 is a cross view of the exemplary semiconductor structure illustrated in FIG. 1.

Reference is first made to FIG. 1 (top down view) and FIG. 2 (cross sectional view), which illustrate an exemplary semiconductor structure in accordance with an embodiment of the present application. The semiconductor structure shown in FIGS. 1 and 2 includes a first interconnect wiring level M1 including a plurality of first wiring structures S1, a second interconnect wiring level M2 including a plurality of second wiring structures S2, and a third interconnect wiring level M3 including a plurality of third wiring structures S3. As is illustrated in FIGS. 1 and 2, the second interconnect wiring level M2 is between the first interconnect wiring level M1, and the third interconnect wiring level M3. and the plurality of first wiring structures S1 and the plurality of third wiring structures S3 are oriented in a same lateral direction; the plurality of second wiring structures S2 are oriented in a different lateral direction than the plurality of first wiring structures S1 and the plurality of third wiring structures S3. For example, and as is illustrated, the wiring structures S1 and S2 have a length wise direction that runs into and out of the plane of the drawing sheet that contains FIG. 2, while the second wiring structures S2 have a length direction that runs perpendicular to the length wise direction of the first and third wiring structures S1 and S3.

In the illustrated structure shown in FIGS. 1 and 2, the plurality of first wiring structures S1 and the plurality of third wiring structures S3 are laterally offset from each other. The structure further includes a skip-level via structure 16 electrically connecting the first interconnect wiring level M1 and the third interconnect wiring level M3.

As is illustrated in FIGS. 1 and 2, the skip-level via structure 16 lands on an extension region 11 of one of the first wiring structures of the plurality of first wiring structures S1. The skip-level via structure 16 does not need to land entirely within the extension region 11; a portion of the skip level via structure 16 can land on a non-extended region of the wiring structure that includes the extension region 11 (See, for example, FIG. 2 of the present application). The first wiring structure S1 having the extension region 11 has a width, W2, that is larger than a width, W1, of the other first wiring structures S1 (See for example, the first wiring structure S1 to the left of the first wiring structure having extension region 11). In the present application, W2 can be from 10 nm to 50 nm, while W1 can be from 5 nm to 25 nm. The width of the extension region 11 is typically from 5 nm to 25 nm. More typically, W2 can be from 10 nm to 30 nm, W1 can be from 10 nm to 20 nm, and the width of the extension region 11 can be from 5 nm to 10 nm.

As is illustrated in FIG. 2, the first wiring structure S1 having the extension region 11 has a width, W2, that is larger than a width, W3, of at least a bottommost portion of the skip-level via 16. In the present application, W3 is from 10 nm to 30 nm, with W3 being more typically from 15 nm to 25 nm; values of W2 have been provided above.

In some embodiments, and as is illustrated in FIG. 1, the skip-level via structure 16 can be centered along a width WM3 of the third interconnect wiring level M3. This aspect of the present application is important since dual damascene integration requires that vias be fully enclosed (and ideally centered) by the line above. The patterning is more difficult to make vias which are off-centered with respect to the line above. In other embodiments (not illustrated), the skip-level via structure 16 need not be centered along a width WM3 of the third interconnect wiring level M3. In some embodiments, and as is illustrated in FIG. 1, the skip-level via structure 16 is offset from a width WM1 of the first interconnect wiring level. This aspect of the present application is important because without the extension region 11, a direct electrical connection between the offset first and third wiring structures would not be possible. By enabling a direct electrical connection between the first and third wiring structures even when they are offset relative to one another, provides significant design flexibility.

In the present application and as is illustrated in FIG. 2, the skip-level via structure 16 includes a first layer 15 of an electrically conductive metal or an electrically conductive metal alloy. In some embodiments, and is illustrated in FIG. 2, the skip-level via structure 16 further includes a diffusion barrier liner 12 located on a sidewall and a bottom wall of the first layer 15 of the electrically conductive metal or the electrically conductive metal alloy. In the present application and as is further illustrated in FIG. 2, each of the first wiring structures S1 (including the first wiring structure having the extension region 11), the second wiring structures S2 and the third wiring structures S3 include a second layer 10 of an electrically conductive metal or an electrically conductive metal alloy. In some embodiments, the second layer 10 of the electrically conductive metal or the electrically conductive metal alloy is compositionally the same as the first layer 15 of the electrically conductive metal or the electrically conductive metal alloy. In other embodiments, the second layer 10 of the electrically conductive metal or the electrically conductive metal alloy is compositionally different from the first layer 15 of the electrically conductive metal or the electrically conductive metal alloy. In each of these embodiments, the electrically conductive material that provides the second layer 10 in the various interconnect wiring levels can be compositionally the same or compositionally different from each other. In some embodiments, and is illustrated in FIG. 2, the first wiring structures, S1, the second wiring structures S2 and the third wiring structures S3 further include a diffusion barrier liner 12 located on a sidewall and a bottom wall of the second layer 10 of the electrically conductive metal or the electrically conductive metal alloy.

Illustrative examples of electrically conductive metals that can be used in providing the first layer 15 and the second layer 10 include, but are not limited to, copper (Cu), aluminum (Al), tungsten (W), ruthenium (Ru), or cobalt (Co). Illustrative examples of electrically conductive metal alloys that can be used in the present application to provide the first layer 15 and the second layer 10 include, but are not limited to, a Cu—Al alloy, a Cu—W alloy, or Ru—Co alloy.

The diffusion barrier liner 12 that can be employed in the present application is composed of a diffusion barrier material that prevents another material from diffusing therethrough. Illustrative examples of diffusion barrier materials that can be used as the diffusion barrier liners 12 include, but are not limited to, Ta, TaN, Ti, TiN, W or WN. In some embodiments, the diffusion barrier liner 12 can include a material stack of two or more diffusion barrier materials. In one example, the diffusion barrier liner 12 can be composed of a stack of Ta/TaN or Ti/TiN. The diffusion barrier liner 12 that lines each second layer 10 of the electrically conductive material and the first layer 15 of electrically conductive material can be composed of a compositionally same, or a compositionally different, diffusion barrier material. The diffusion barrier liner 12 that lines the second layer 10 of the wiring structures in the various interconnect wiring levels can be composed of a compositionally same diffusion barrier material, or compositionally different diffusion barrier materials can be used. The diffusion barrier liner 12 can have a thickness from 2 nm to 50 nm; although other thicknesses for the diffusion barrier liner 12 are contemplated and can be employed in the present application.

In the present application, and as would be apparent to one skilled in the art, each of the plurality of first wiring structures S1, the plurality of second wiring structures S2 and the plurality of third wiring structures S3 is embedded in an interconnect dielectric material layer (not shown). In the embodiments illustrated in FIGS. 1 and 2, the skip-level via structure 16 passes through the interconnect dielectric material layer that embeds the plurality of second wiring structures S2. In the drawings, the interconnect dielectric material layer would be located laterally adjacent to each wiring structure that is present in a particular interconnect wiring level.

The various interconnect dielectric material layers can be composed of an inorganic dielectric material, an organic dielectric material or a combination of inorganic and organic dielectric materials. In some embodiments, the various interconnect dielectric material layers can be porous. In other embodiments, the various interconnect dielectric material layers can be non-porous. In yet other embodiments, some of the interconnect dielectric material layers can be porous and other interconnect dielectric materials can be non-porous. Examples of suitable dielectric materials that can be employed in providing the various interconnect dielectric material layers include, but are not limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The various interconnect dielectric material layers can have a dielectric constant (all dielectric constants mentioned herein are measured relative to a vacuum, unless otherwise stated) that is about 4.0 or less. In one embodiment, the various interconnect dielectric material layers has a dielectric constant of 2.8 or less. These dielectrics generally have a lower parasitic cross talk as compared to dielectric materials whose dielectric constant is greater than 4.0.

Figure 3:
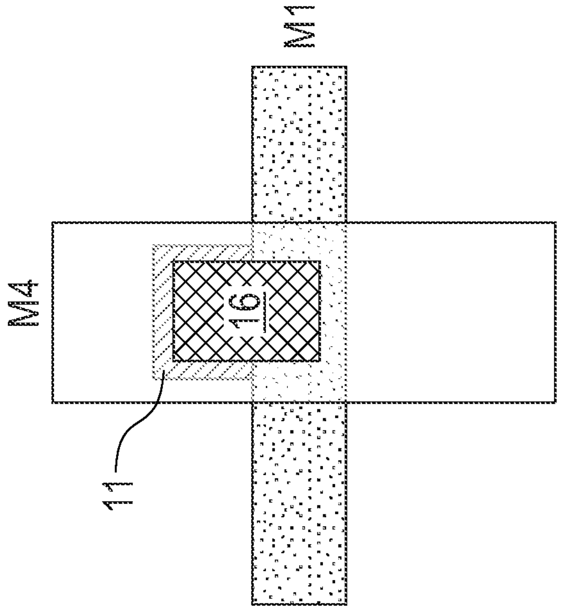
FIG. 3 is a top down view illustrating another exemplary semiconductor structure in accordance with another embodiment of the present application.

Reference is now made to FIG. 3 (top down view), which illustrates another exemplary semiconductor structure in accordance with another embodiment of the present application. In this embodiment, the semiconductor structure includes a first interconnect wiring level M1 including a plurality of first wiring structures, a second interconnect wiring level M2 including a plurality of second wiring structures, a third interconnect wiring level M3 including a plurality of third wiring structures, and a fourth interconnect wiring level M4 including a plurality of fourth wiring structures. The various wiring structures are not shown in the top down view depicted in FIG. 3, but would be readily apparent to those skilled in the art by viewing FIG. 2 of the present application. According to this embodiment, the third interconnect wiring level M3 is located between the second interconnect wiring level M2 and the fourth interconnect wiring level M4, and the plurality of first wiring structures and the plurality of fourth wiring structures run perpendicular to each other. This is apparent from FIG. 3 in which M1 runs perpendicular to M4. The structure further includes a skip-level via structure 16 electrically connecting the first interconnect wiring level M1 and the fourth interconnect wiring level M4. In this embodiment, the skip-level via structure 16 lands on an extension region 11 of one of the first wiring structures of the plurality of first wiring structures. Similar to the previously exemplified embodiment, the first wiring structure having the extension region 11 has a width, W2, that is larger than a width, W1, of the other first wiring structures. Likewise, the first wiring structure having the extension region 11 has a width, W2, that is larger than a width, W3, of at least a bottommost portion of the skip-level via structure 16.

As in the previous embodiment of the present application, the skip-level via structure 16 includes a first layer 15 of an electrically conductive metal or an electrically conductive metal alloy, as defined above. In some embodiments, a diffusion barrier liner (not shown in the top down view of FIG. 3) can be located on a sidewall and a bottom wall of the first layer 15 of the electrically conductive metal or the electrically conductive metal alloy.

As in the previous embodiment, the first wiring structures, the second wiring structures, the third wiring structures and also the fourth wiring structures include a second layer 10 of an electrically conductive metal or an electrically conductive metal alloy, as defined above. Like the previous embodiment, the second layer 10 of the electrically conductive metal or the electrically conductive metal alloy can be compositionally the same as the first layer 15 of the electrically conductive metal or the electrically conductive metal alloy, or the second layer 10 is compositionally different from the first layer 15 of the electrically conductive metal or the electrically conductive metal alloy.

An interconnect dielectric material layer as defined above is present in each of the first interconnect wiring level M1, the second interconnect wiring level M2, the third interconnect wiring level M3 and the fourth interconnect wiring level M4. In this embodiment, the skip-level via structure 16 passes through the interconnect dielectric material layer that is present in both the second interconnect dielectric material layer and the third interconnect dielectric material layer.

The semiconductor structures of the present application can be formed by first providing a first interconnect wiring level that contains a plurality of first wiring structures in which at least one of the first wiring structures has the extension region. In some embodiments, the first interconnect wiring level can be obtained utilizing a damascene process that includes forming a first interconnect dielectric material layer by a deposition process such as, for example, chemical vapor deposition (CVD), plasma enhanced chemical vapor deposition (PECVD), physical vapor deposition (PVD) or spin-on coating. Next, openings are formed in the first interconnect dielectric material layer by lithography and etching. Block mask technology can be used to protect the openings all but the ones requiring the extension region, and thereafter a second etch can be used to enlarge the openings that require the extension region. The first wiring structures are then formed into each of the openings and the openings containing the extension region by deposition of an optional diffusion barrier material layer and deposition of an electrically conductive metal or an electrically conductive metal alloy in each of the openings including the openings containing the extension region and on top of the first interconnect dielectric material layer, and then a planarization process such as, for example, chemical mechanical polishing (CMP), can be used to remove the optional diffusion barrier material layer and the electrically conductive material that are formed outside of the openings thereby forming first wiring structures. Some of the first wiring structures have the extension region and some of the first wiring structures do not contain the extension region. The deposition of the diffusion barrier material layer and the electrically conductive material can include one of CVD, PECVD, PVD, atomic layer deposition (ALD), sputtering or plating.

In other embodiments, the first interconnect wiring level can be obtained utilizing a subtractive process which includes first forming a blanket layer of an electrically conductive metal or metal alloy by a deposition process such as, for example, CVD, PECVD, PVD, ALD, sputtering or plating. Lithographic patterning can be used to provide metal structures from this blanket layer. The metal structures that are produced each have the extension region. Block mask technology can then be used to protect some of the metal structures having the extension region, while leaving other metal structures unprotected, and then an etch can be used to pattern those metal structures that are not protected by the block mask. This forms first wiring structures some of which have the extension regions (the block mask protected metal structures) and the others not having the extension region (etched metal structures). The first interconnect dielectric material layers is then formed by a deposition process as mentioned above laterally adjacent to each of the metal structures that are formed.

After defining the first wiring level, a second wiring level, a third wiring level and optionally a fourth wiring level are formed utilizing techniques well known to those skilled in the art. The skip-level via structure can be formed between the various interconnect wiring levels that need connection, i.e. the first and third interconnect wiring levels or the first and fourth interconnect wiring levels, by forming a skip-level via opening (by lithography and etching) in the various wiring levels that are between the two interconnect wiring levels in which skip-level via structure connection is desired. The skip-level via opening lands on the extension region of one of the first wiring structures that contains the extension region. Next, the optional diffusion barrier material layer and the electrically conductive material are formed into and outside of the skip-level via opening, and a planarization process is then used to remove the optional diffusion barrier material layer and the electrically conductive materially that are formed outside of the skip-level via opening. The final interconnect wiring level, i.e., third or fourth interconnect wiring level, is then formed utilizing techniques that are known to those skilled in the art.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a first interconnect wiring level comprising a plurality of first wiring structures, wherein at least one of the first wiring structures of the plurality of first wiring structures has a second width that is greater than a first width of each remaining first wiring structure of the plurality of first wiring structures, wherein the second width is a sum of the first width plus a width of an extension region;

a second interconnect wiring level comprising a plurality of second wiring structures;

a third interconnect wiring level comprising a plurality of third wiring structures, wherein the second interconnect wiring level is between the first interconnect wiring level and the third interconnect wiring level, and the plurality of first wiring structures and the plurality of third wiring structures are oriented in a same lateral direction and wherein the plurality of first wiring structures and the plurality of third wiring structures are laterally offset from each other; and a skip-level via structure contacting at least a portion of the extension region and electrically connecting the first interconnect wiring level and the third interconnect wiring level.

2. The semiconductor structure of claim 1, wherein the first wiring structure having the extension region has a second width is larger than a width of at least a bottommost portion of the skip-level via structure.

3. The semiconductor structure of claim 1, wherein the plurality of second wiring structures are oriented in a different lateral direction than the plurality of first wiring structures and the plurality of third wiring structures.

4. The semiconductor structure of claim 1, wherein the skip-level via structure is centered along a width of the third interconnect wiring level.

5. The semiconductor structure of claim 1, wherein the skip-level via structure is offset from a width of the first interconnect wiring level.

6. The semiconductor structure of claim 1, wherein the skip-level via structure comprises a first layer of an electrically conductive metal or an electrically conductive metal alloy.

7. The semiconductor structure of claim 6, further comprising a diffusion barrier liner located on a sidewall and a bottom wall of the first layer of the electrically conductive metal or the electrically conductive metal alloy.

8. The semiconductor structure of claim 6, wherein each of the first wiring structures, the second wiring structures and the third wiring structures comprises a second layer of an electrically conductive metal or an electrically conductive metal alloy, wherein the second layer of the electrically conductive metal or the electrically conductive metal alloy is compositionally the same as the first layer of the electrically conductive metal or the electrically conductive metal alloy.

9. The semiconductor structure of claim 6, wherein each of the first wiring structures, the second wiring structures and the third wiring structures comprises a second layer of an electrically conductive metal or an electrically conductive metal alloy, wherein the second layer of the electrically conductive metal or the electrically conductive metal alloy is compositionally different from the first layer of the electrically conductive metal or the electrically conductive metal alloy.

10. The semiconductor structure of claim 1, wherein each of the plurality of first wiring structures, the plurality of second wiring structures and the plurality of third wiring structures is embedded in an interconnect dielectric material layer, and the skip-level via structure passes through the interconnect dielectric material layer that embeds the plurality of second wiring structures.

11. A semiconductor structure comprising:

a first interconnect wiring level comprising a plurality of first wiring structures, wherein at least one of the first wiring structures of the plurality of first wiring structures has a second width that is greater than a first width of each remaining first wiring structure of the plurality of first wiring structures, wherein the second width is a sum of the first width plus a width of an extension region;

a second interconnect wiring level comprising a plurality of second wiring structures;

a third interconnect wiring level comprising a plurality of third wiring structures;

a fourth interconnect wiring level comprising a plurality of fourth wiring structures, wherein the third interconnect wiring level is located between the second interconnect wiring level and the fourth interconnect wiring level, and wherein the plurality of first wiring structures and the plurality of fourth wiring structures run perpendicular to each other; and a skip-level via structure a contacting at least a portion of the extension region and electrically connecting the first interconnect wiring level and the fourth interconnect wiring level.

12. The semiconductor structure of claim 11, wherein the first wiring structure having the extension region has a second width is larger than a width of at least a bottommost portion of the skip-level via structure.

13. The semiconductor structure of claim 11, wherein the skip-level via structure comprises a first layer of an electrically conductive metal or an electrically conductive metal alloy.

14. The semiconductor structure of claim 13, further comprising a diffusion barrier liner located on a sidewall and a bottom wall of the first layer of the electrically conductive metal or the electrically conductive metal alloy.

15. The semiconductor structure of claim 13, wherein each of the first wiring structures, the second wiring structures, the third wiring structures and the fourth wiring structures comprises a second layer of an electrically conductive metal or an electrically conductive metal alloy, wherein the second layer of the electrically conductive metal or the electrically conductive metal alloy is compositionally the same as the first layer of the electrically conductive metal or the electrically conductive metal alloy.

16. The semiconductor structure of claim 13, wherein each of the first wiring structures, the second wiring structures, the third wiring structures comprising and the fourth wiring structures comprises a second layer of an electrically conductive metal or an electrically conductive metal alloy, wherein the second layer of the electrically conductive metal or the electrically conductive metal alloy is compositionally different from the first layer of the electrically conductive metal or the electrically conductive metal alloy.

* * * * *